United States Patent
Liu et al.

(10) Patent No.: US 11,360,591 B2
(45) Date of Patent: Jun. 14, 2022

(54) DISPLAY PANEL AND MANUFACTURING METHOD THEREOF

(71) Applicant: Shenzhen China Star Optoelectronics Semiconductor Display Technology Co., Ltd., Shenzhen (CN)

(72) Inventors: Nian Liu, Shenzhen (CN); Macai Lu, Shenzhen (CN); Lei Wen, Shenzhen (CN)

(73) Assignee: Shenzhen China Star Optoelectronics Semiconductor Display Technology Co., Ltd., Shenzhen (CN)

(*) Notice: Subject to any disclaimer, the term of this patent is extended or adjusted under 35 U.S.C. 154(b) by 318 days.

(21) Appl. No.: 16/624,932

(22) PCT Filed: Nov. 11, 2019

(86) PCT No.: PCT/CN2019/116965
§ 371 (c)(1),
(2) Date: Dec. 20, 2019

(87) PCT Pub. No.: WO2021/082066
PCT Pub. Date: May 6, 2021

(65) Prior Publication Data
US 2021/0216155 A1   Jul. 15, 2021

Related U.S. Application Data

(63) Continuation of application No. PCT/CN2019/116965, filed on Nov. 11, 2019.

(51) Int. Cl.
*G06F 3/041* (2006.01)
*H01L 27/144* (2006.01)
(Continued)

(52) U.S. Cl.
CPC ........ *G06F 3/0412* (2013.01); *H01L 27/1446* (2013.01); *H01L 31/1136* (2013.01); *H01L 31/18* (2013.01); *G06F 2203/04103* (2013.01)

(58) Field of Classification Search
CPC ......... G06F 3/0412; G06F 2203/04103; H01L 27/1446; H01L 31/1136; H01L 31/18;
(Continued)

(56) References Cited

U.S. PATENT DOCUMENTS

2009/0283762 A1   11/2009   Kimura
2018/0175232 A1*  6/2018   Liu ................... H01L 27/14659

FOREIGN PATENT DOCUMENTS

CN   102629569   8/2012
CN   103000628   3/2013
(Continued)

*Primary Examiner* — Alexander Eisen
*Assistant Examiner* — Kebede T Teshome

(57) ABSTRACT

The disclosure provides a display panel and a manufacturing method thereof. The method includes: forming a main gate and a sub-gate on a glass substrate, wherein at least a portion of the sub-gate includes a light transmissive area; sequentially forming a gate insulating layer, a semiconductor layer, and a second metal layer on the sub-gate, patterning the semiconductor layer to obtain a main active layer and a sub-active layer, and patterning the second metal layer to obtain a main source/drain and a sub-source/drain.

17 Claims, 4 Drawing Sheets

(51) Int. Cl.
*H01L 31/113* (2006.01)
*H01L 31/18* (2006.01)

(58) Field of Classification Search
CPC ............. H01L 27/1259; H01L 27/1222; H01L 27/1237; H01L 27/124; H01L 27/127; H01L 29/401; H01L 29/41725; H01L 29/42356; H01L 29/42364
See application file for complete search history.

(56) References Cited

FOREIGN PATENT DOCUMENTS

| | | | |
|---|---|---|---|
| CN | 105977268 | | 9/2016 |
| CN | 109742086 | | 5/2019 |
| CN | 109742086 | A * | 5/2019 |

\* cited by examiner

DISPLAY PANEL AND MANUFACTURING METHOD THEREOF

RELATED APPLICATIONS

This application is a National Phase of PCT Patent Application No. PCT/CN2019/116965 having International filing date of Nov. 11, 2019, which claims the benefit of priority of Chinese Patent Application No. 201911034331.6 filed on Oct. 29, 2019. The contents of the above applications are all incorporated by reference as if fully set forth herein in their entirety.

FIELD AND BACKGROUND OF THE INVENTION

The present disclosure relates to the field of display technology and, more particularly, relates to a display panel and a manufacturing method thereof.

Current touch control technologies include on-cell touch control technology and in-cell touch control technology. In on-cell touch control technology, a touch control sensor and a fingerprint recognition sensor are independently mounted outside a display panel so that a fixed-point sensing function on the display panel cannot be realized.

In in-cell touch control technology, a touch controller is embedded into liquid crystal pixels and a top of in-cell touch control panels is usually irradiated with light. However, the above way is easy to be affected by an area of a tunnel and defects of a backside of the tunnel, thereby resulting in low photocurrent and reduced sensitivity and accuracy of a touch control function.

Consequently, it is necessary to provide a display panel and a manufacturing method thereof to solve problems existing in a conventional technology.

SUMMARY OF THE INVENTION

An objective of the present disclosure is to provide a display panel and a manufacturing method thereof to enhance a photocurrent, thereby improving sensitivity and accuracy of a touch control function.

To solve the above technical problem, the present disclosure provides a method of manufacturing a display panel, including: forming a transparent electrode layer on a glass substrate, and patterning the transparent electrode layer to obtain a main light transmissive section and a sub-light transmissive section; forming a first metal layer on the main light transmissive section, the sub-light transmissive section, and the glass substrate, and patterning the first metal layer to obtain a first gate section and a second gate section, wherein a main gate includes the first gate section and the main light transmissive section, a sub gate includes the second gate section and the sub-light transmissive section, and a position corresponding to the sub-light transmissive section form a light transmissive area; forming a gate insulating layer on the main gate, the sub-gate, and the glass substrate; forming a semiconductor layer on the gate insulating layer, and patterning the semiconductor layer to obtain a main active layer and a sub-active layer, wherein a position of the sub-active layer corresponds to a position of the light transmissive area; and forming a second metal layer on the main active layer, the sub-active layer, and the gate insulating layer, and patterning the second metal layer to form a main source/drain and a sub-source/drain.

The sub-gate, the sub-active layer, and the sub-source/drain form a sub-thin film transistor (sub-TFT).

A first current is generated when a bottom of the sub-TFT is irradiated with light, a second current is generated when a top of the sub-TFT is irradiated with light, and the first current is greater than the second current.

The present disclosure provides a method of manufacturing a display panel, including: forming a main gate and a sub-gate which are spaced from each other on a glass substrate, wherein at least a portion of the sub-gate includes a light transmissive area; forming a gate insulating layer on the main gate, the sub-gate, and the glass substrate; forming a semiconductor layer on the gate insulating layer, and patterning the semiconductor layer to obtain a main active layer and a sub-active layer, wherein a position of the sub-active layer corresponds to a position of the light transmissive area; and forming a second metal layer on the main active layer, the sub-active layer, and the gate insulating layer, and patterning the second metal layer to form a main source/drain and a sub-source/drain.

The present disclosure further provides a display panel, including: a glass substrate; a main gate and a sub-gate which are disposed on the glass substrate and spaced from each other, wherein at least a portion of the sub-gate includes a light transmissive area; a gate insulating layer disposed on the main gate, the sub-gate, and the glass substrate; a main active layer and a sub-active layer which are disposed on the gate insulating layer, wherein a position of the active layer corresponds to a position of the light transmissive area; a main source/drain disposed on the main active layer and the gate insulating layer; and a sub-source/drain disposed on the sub-active layer and the gate insulating layer.

In the display panel and the manufacturing method thereof provided by the present disclosure, a main gate and a sub-gate which are spaced from each other are formed on a glass substrate. At least a portion of the sub-gate includes a light transmissive area. A gate insulating layer is formed on the main gate, the sub-gate, and the glass substrate, a semiconductor layer is formed on the gate insulating layer, and a main active layer and a sub-active layer are formed by patterning the semiconductor layer. A position of the sub-active layer corresponds to a position of the light transmissive area. A second metal layer is formed on the main active layer, the sub-active layer, and the gate insulating layer. A main source/drain and a sub-source/drain are formed by patterning the second metal layer. Since a portion of the sub-gate which corresponds to the sub-active layer is the light transmissive area, a light irradiation area of a sub-thin film transistor (sub-TFT) is enlarged. As a result, a photocurrent is enhanced, thereby further improving sensitivity and accuracy of a touch control function.

DESCRIPTION OF SPECIFIC EMBODIMENTS OF THE INVENTION

Figure 1:
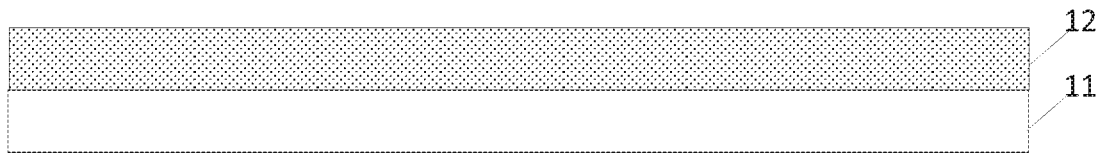
FIG. 1 is a schematic structural view showing a display panel manufactured by a method provided by a first embodiment of the present disclosure after a first sub-step of a first step.

The following description of the various embodiments is provided with reference to the accompanying drawings. It should be understood that terms such as "upper", "lower", "front", "rear", "left", "right", "inside", "outside", "lateral", as well as derivative thereof should be construed to refer to the orientation as then described or as shown in the drawings under discussion. These relative terms are for convenience of description, do not require that the present disclosure be constructed or operated in a particular orientation, and shall not be construed as causing limitations to the present disclosure. In the drawings, the identical or similar reference numerals constantly denote the identical or similar elements or elements having the identical or similar functions.

Referring to FIG. 1 to FIG. 11, the present disclosure provides a method of manufacturing a display panel, including the following steps:

Step 11: forming a main gate and a sub-gate which are spaced from each other on a glass substrate, wherein at least a portion of the sub-gate includes a light transmissive area.

Figure 4:
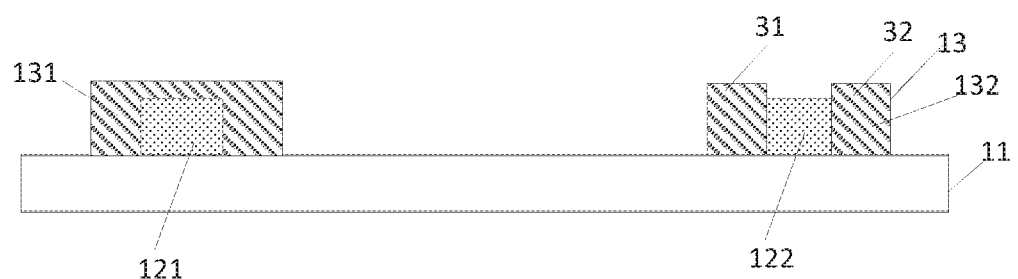
FIG. 4 is a schematic structural view showing the display panel manufactured by the method provided by the first embodiment of the present disclosure after a second sub-step of the second step.
Figure 10:
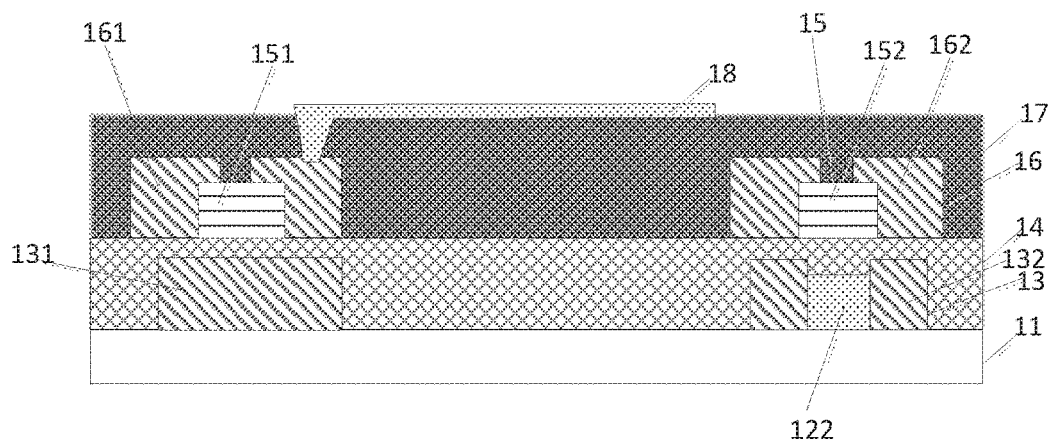
FIG. 10 is a schematic structural view showing a display panel provided by a second embodiment of the present disclosure.
Figure 11:
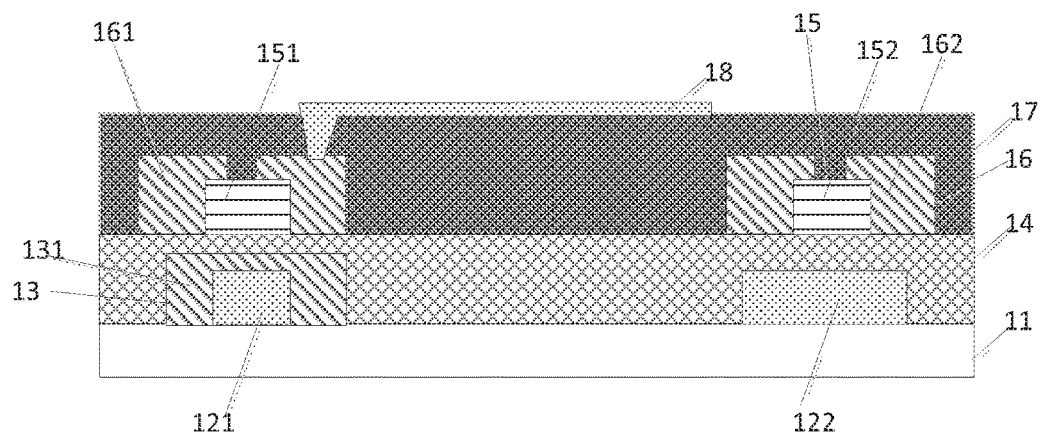
FIG. 11 is a schematic structural view showing a display panel provided by a third embodiment of the present disclosure.

As shown in FIG. 4, in one embodiment, a main gate and a sub-gate which are spaced from each other are formed on a glass substrate 11, the main gate includes a first gate section 131 and a main light transmissive section 121, and the sub-gate includes a second gate section 132 and a sub-light transmissive section 122. A position corresponding to the sub-light transmissive section 122 is a light transmissive area (not shown). As shown in FIG. 10, it should be noted that the main gate may not include the main light transmissive section 121, that is, the entire main gate is a non-light transmissive area. As shown in FIG. 11, the entire sub-gate may be the light transmissive area.

Step 12: forming a gate insulating layer on the main gate and the sub-gate.

Figure 5:
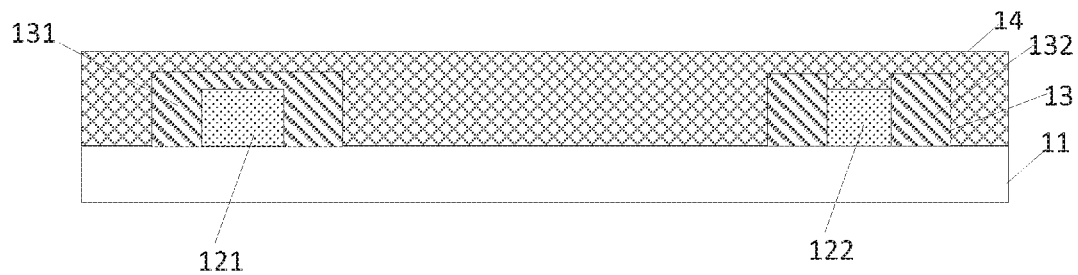
FIG. 5 is a schematic structural view showing the display panel manufactured by the method provided by the first embodiment of the present disclosure after a third step.

As shown in FIG. 5, a gate insulating layer 14 is formed on the main gate and the sub-gate. A material of the gate insulating layer 14 may be at least one of SiNx or SiOx, that is, the gate insulating layer 14 may be a single layer or a stacked layer of SiOx and SiNx.

Step 13: forming a semiconductor layer on the gate insulating layer, and patterning the semiconductor layer to obtain a main active layer and a sub-active layer, wherein a position of the sub-active layer corresponds to a position of the light transmissive area.

Figure 6:
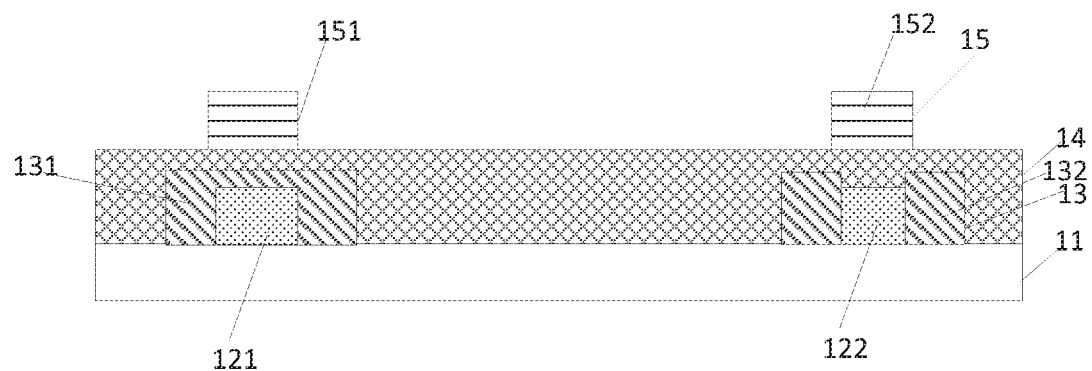
FIG. 6 is a schematic structural view showing the display panel manufactured by the method provided by the first embodiment of the present disclosure after a fourth step.

For example, as shown in FIG. 6, a semiconductor layer 15 is formed on the gate insulating layer 14, the semiconductor layer 15 is patterned to obtain a main active layer 151 and a sub-active layer 152, and a position of the sub-active layer 152 corresponds to a position of the light transmissive area (a position of the sub-light transmissive section 122).

Step 14: forming a second metal layer on the main active layer, the sub-active layer, and the gate insulating layer, and patterning the second metal layer to form a main source/drain and a sub-source/drain.

Figure 7:
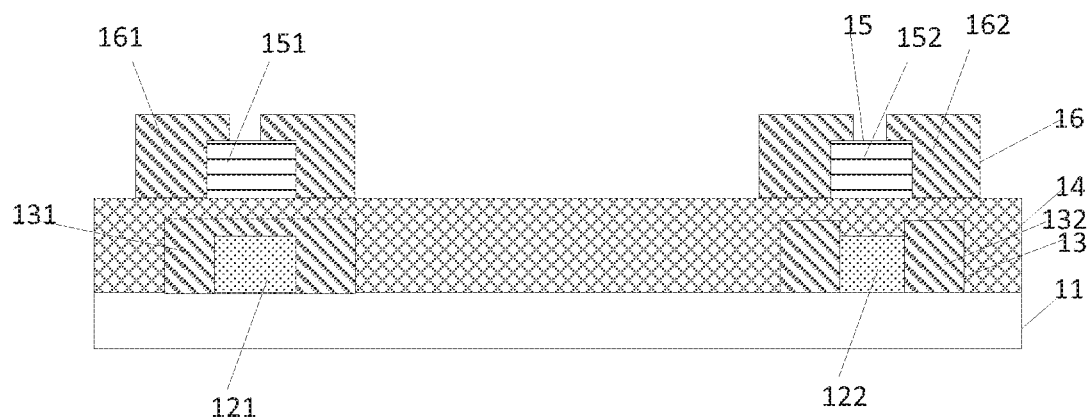
FIG. 7 is a schematic structural view showing the display panel manufactured by the method provided by the first embodiment of the present disclosure after a fifth step.

For example, as shown in FIG. 7, a second metal layer 16 is formed on the main active layer 151, the sub-active layer 152, and the gate insulating layer 14, and the second metal layer 16 is patterned to form a main source/drain 161 and a sub-source/drain 162. A structure of the second metal layer 16 may be a stacked layer of Mo and Al or a stacked layer of Mo and Cu.

The main gate, the main active layer 151, and the main source/drain 161 form a main thin film transistor (TFT) which is a switch on the left side of FIG. 7. The sub-gate, the sub-active layer 152, and the sub-source/drain 162 form a sub-TFT which is a sensor on the right side of FIG. 7.

Referring to FIG. 1 to FIG. 8, FIG. 1 is a schematic structural view showing a display panel manufactured by a method provided by a first embodiment of the present disclosure after a first sub-step of a first step.

A method of manufacturing a display panel provided by the present embodiment includes:

Step 101: forming a transparent electrode layer on a glass substrate, and patterning the transparent electrode layer to obtain a main light transmissive section and a sub-light transmissive section.

Figure 2:
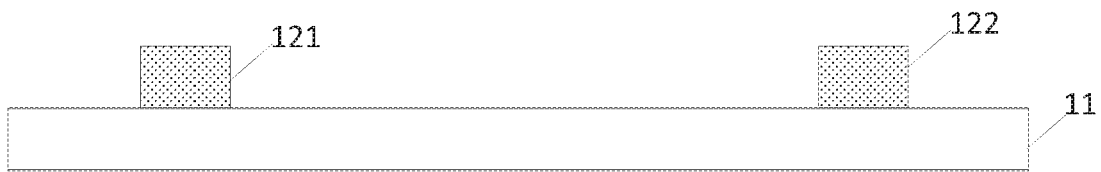
FIG. 2 is a schematic structural view showing the display panel manufactured by the method provided by the first embodiment of the present disclosure after a second sub-step of the first step.

For example, as shown in FIG. 1 and FIG. 2, a transparent electrode layer 12 is formed on the glass substrate 11, and the transparent electrode layer 12 is patterned to form a main light transmissive section 121 and a sub-light transmissive section 122. To enhance a photocurrent, a material of the transparent electrode 12 may include at least one of indium tin oxide (ITO), a nanosilver line, or aluminum-doped zinc oxide (AZO).

Step 102: forming a first metal layer on the main light transmissive section, the sub-light transmissive section, and the glass substrate, and patterning the first metal layer to obtain a first gate section and a second gate section.

Figure 3:
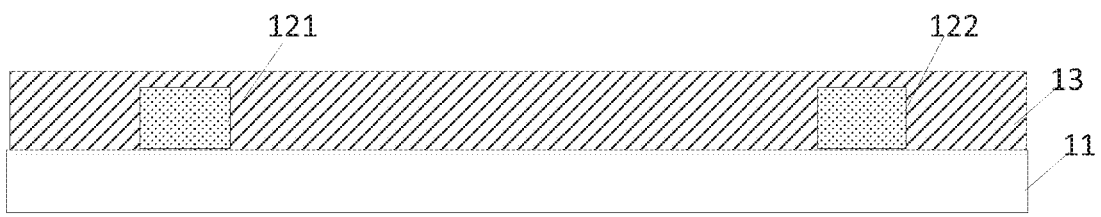
FIG. 3 is a schematic structural view showing the display panel manufactured by the method provided by the first embodiment of the present disclosure after a first sub-step of a second step.

For example, as shown in FIG. 3 and FIG. 4, a first metal layer 13 is formed on the main light transmissive section 121 and the sub-light transmissive section 122, and the first metal layer 13 is patterned to obtain a first gate section 131 and a second gate section 132. A structure of the first metal layer 13 may be a stacked layer of Mo and Al or a stacked layer of Mo and Cu.

The first gate section 131 covers the main light transmissive section 121 to obtain a main gate. To simplify a manufacturing process, the second gate section 132 may be disposed at two sides of the sub-light transmissive section 122 to obtain a sub-gate. The second gate section 132 includes a first part 31 and a second part 32 which are respectively disposed at two sides of the light transmissive section 122. A position corresponding to the sub-light transmissive section 122 is the light transmissive area.

The main gate includes the first gate section 131 and the main light transmissive section 121, the sub-gate includes the second gate section 132 and the sub-light transmissive section 122, and the position corresponding to the sub-light transmissive section 122 is the light transmissive area (not shown).

Step 103: forming a gate insulating layer on the main gate and the sub-gate.

For example, as shown in FIG. 5, a gate insulating layer 14 is deposited on the main gate and the sub-gate. A material of the gate insulating layer 14 may be at least one of SiNx or SiOx, that is, the gate insulating layer 14 may be a single layer or a stacked layer of SiOx and SiNx.

Step 104: forming a semiconductor layer on the gate insulating layer, and patterning the semiconductor layer to obtain a main active layer and a sub-active layer, wherein a position of the sub-active layer corresponds to a position of the light transmissive area.

For example, as shown in FIG. 6, a semiconductor layer 15 is formed on the gate insulating layer 14, the semiconductor layer 15 is patterned to obtain a main active layer 151 and a sub-active layer 152, and a position of the sub-active layer 152 corresponds to a position of the light transmissive area (a position of the sub-light transmissive section 122).

In one embodiment, a mask configured to pattern the transparent electrode layer and a mask configured to pattern the semiconductor layer are same so that a position of the main active layer 151 may correspond to a position of the main light transmissive section 121, thereby saving the mask and keeping the manufacturing cost down.

A material of the semiconductor layer 15 may include at least one of an oxide semiconductor, amorphous silicon, polysilicon, or an organic semiconductor.

Step 105: forming a second metal layer on the main active layer, the sub-active layer, and the gate insulating layer, and patterning the second metal layer to form a main source/drain and a sub-source/drain.

For example, as shown in FIG. 7, a second metal layer 16 is formed on the main active layer 151, the sub-active layer 152, and the gate insulating layer 14, and the second metal layer 16 is patterned to form a main source/drain 161 and a sub-source/drain 162. A structure of the second metal layer 16 may be a stacked layer of Mo and Al or a stacked layer of Mo and Cu.

The main gate, the main active layer 151, and the main source/drain 161 form a main thin film transistor (TFT) which is a switch on the left side of FIG. 7. The sub-gate, the sub-active layer 152, and the sub-source/drain 162 form a sub-TFT which is a sensor on the right side of FIG. 7.

A first current is generated when a bottom of the sub-TFT is irradiated with light, a second current is generated when a top of the sub-TFT is irradiated with light, and the first current is greater than the second current. The first current is greater than or equal to five times the second current.

The above method may further include:

Step 107: forming a passivation layer on the main source/drain and the sub-source/drain, wherein an opening is defined in the passivation layer.

Figure 8:
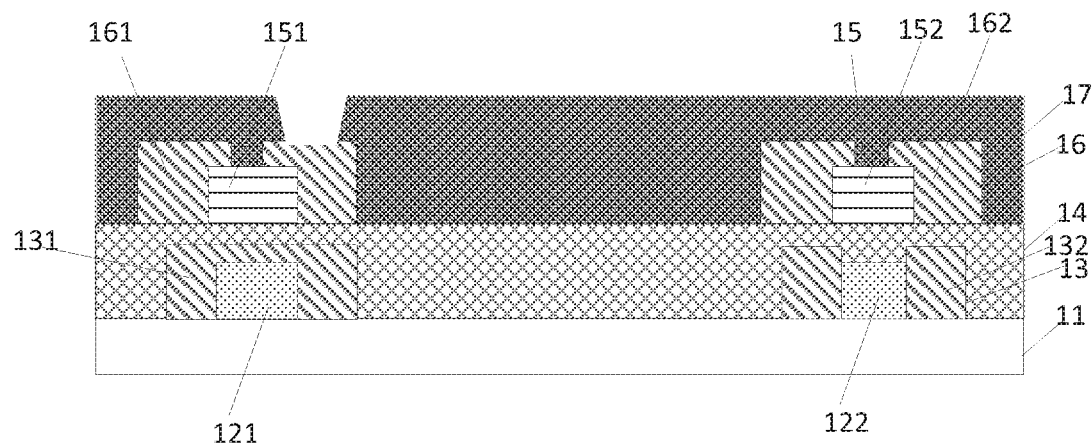
FIG. 8 is a schematic structural view showing the display panel manufactured by the method provided by the first embodiment of the present disclosure after a sixth step.

As shown in FIG. 8, a passivation layer 17 is deposited on the main source/drain 161 and the sub-source/drain 162, and an opening (not shown) is defined in the passivation layer 17. A structure of the passivation layer 17 may be a single layer of SiNx or a stacked layer of SiOx and SiNx.

Step 108: forming a pixel electrode on the passivation layer and in the opening, wherein the pixel electrode and the main drain are connected by the opening.

Figure 9:
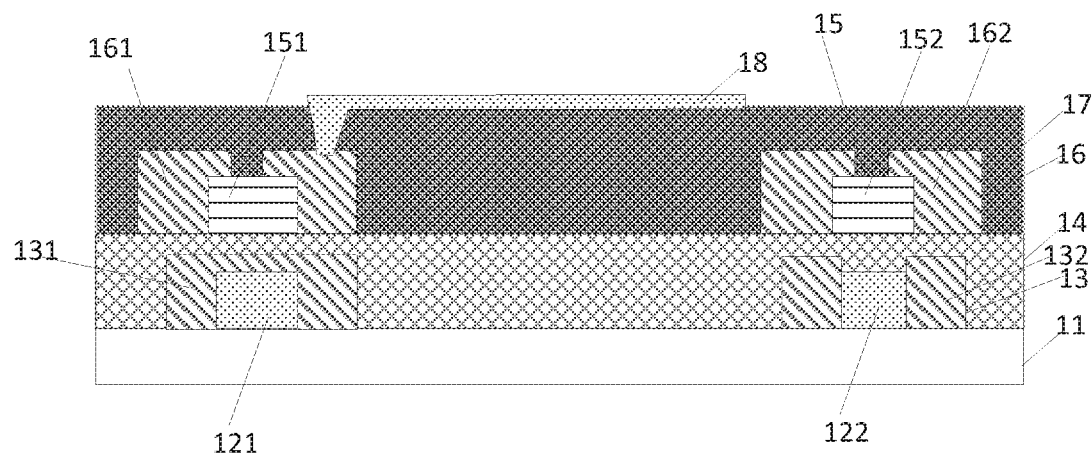
FIG. 9 is a schematic structural view showing the display panel manufactured by the method provided by the first embodiment of the present disclosure after a seventh step.

As shown in FIG. 9, a transparent electrode layer is formed on the passivation layer 17 and in the opening, the transparent electrode layer is patterned to form a pixel electrode 18, and the pixel electrode 18 is connected to the main drain by the opening.

As shown in FIG. 9, the present embodiment further provides a display panel, including the glass substrate 11, a main gate, a sub-gate, a gate insulating layer 14, a main-active layer 151, a sub-active layer 152, a main source/drain 161, and a sub-source/drain 162.

The main gate and the sub-gate are spaced from each other and are disposed on the glass substrate 11. In one embodiment, the main gate includes a first gate section 131 and a main light transmissive section 121, and the first gate section 131 may cover the main light transmissive section 121.

The sub-gate includes a sub-light transmissive section 122 and a second gate section 132, and the sub-light transmissive section 122 corresponds to a position of a light transmissive area. Referring to FIG. 4, the second gate section 132 may include a first part 31 and a second part 32 which are respectively disposed at two sides of the sub-light transmissive section 122. Of course, the second gate section 132 may only be disposed at one side of the sub-light transmissive section 122.

The gate insulating layer 14 is disposed on the main gate and the sub-gate.

The main active layer and the sub-active layer are disposed on the gate insulating layer 14. A position of the active layer 152 corresponds to a position of the light transmissive area.

The main source/drain 161 is disposed on the main active layer 151 and the gate insulating layer 14.

The sub-source/drain 162 is disposed on the sub-active layer 152 and the gate insulating layer 14.

In addition, the display panel may include a passivation layer 17 and a pixel electrode 18.

A portion of the sub-gate is a light transmissive area which corresponds to a position of a sub-active layer, that is, the light transmissive area is formed from a transparent conductive layer. As a result, a light irradiation area of a sub-TFT is enlarged, thereby enhancing a photocurrent and improving sensitivity and accuracy of a touch control function.

Referring to FIG. 10, FIG. 10 is a schematic structural view showing a display panel provided by a second embodiment of the present disclosure.

Of course, as shown in FIG. 10, based on the above embodiment, a difference between the present embodiment and the above embodiment is: structures of the main gate of two embodiments are different. Specifically, the first step and the second step of the above embodiment are substituted by step 201 and step 202.

Step 201: forming a transparent electrode layer on a glass substrate, and patterning the transparent electrode layer to obtain a sub-light transmissive section.

As shown in FIG. 10, a transparent electrode layer 12 is formed on the glass substrate 11, and the transparent electrode layer 12 is patterned to obtain a sub-light transmissive section 122. That is, in the present embodiment, the left side of a TFT does not include a main light transmissive section, which means a mask used in the step 201 and a mask configured to manufacture an active layer are different.

Step 202: forming a first metal layer on the sub-light transmissive section and the glass substrate, and patterning the first metal layer to obtain a main gate and a second gate section.

For example, a first metal layer 13 is formed on the sub-light transmissive section 122, and the first metal layer 13 is patterned to obtain a first gate section 131 and a second gate section 132. A structure of the first metal layer 13 may be a stacked layer of Mo and Al or a stacked layer of Mo and Cu.

The first gate section 131 is a main gate. That is, the main gate does not include the main light transmissive section, which means the entire main gate is a non-light transmissive area. The sub-gate section includes a second gate section 132 and a sub-light transmissive section 122, and a position corresponding to the sub-light transmissive section 122 is the light transmissive area. That is, the sub-light transmissive section 122 corresponds to a position of the light transmissive area (not shown).

The difference between a display panel of the present embodiment and the display of the above embodiment is: in the present embodiment, the main gate is the first gate section 131, that is, the main gate does not include the main light transmissive section.

Referring to FIG. 11, FIG. 11 is a schematic structural view showing a display panel provided by a third embodiment of the present disclosure.

Of course, as shown in FIG. 11, based on the first embodiment, a difference between the present embodiment and the first embodiment is: in the present embodiment, the entire sub-gate is the light transmissive region. The step 202 of the second embodiment may be substituted by step 302.

Step 302: forming a first metal layer on the main light transmissive section and the sub-light transmissive section, and patterning the first metal layer to obtain a first gate section, wherein a main gate includes the first gate section and the main light transmissive section, and a sub-gate is the sub-light transmissive section.

For example, as shown in FIG. 11, a first metal layer 13 is formed on the main light transmissive section 121 and the sub-light transmissive section 122, and the first metal layer 13 is patterned to obtain a first gate section 131. A main gate includes the first gate section 131 and the main light transmissive section 121, a sub-gate is the sub-light transmissive section 122, and a position corresponding to the sub-light transmissive section 122 is a light transmissive area (not shown). The sub-light transmissive section 122 covers a sub-source/drain. That is, in the present embodiment, the right side of a TFT does not include a second gate section, which means the entire gate is the light transmissive area.

The difference between a display panel of the present embodiment and the display of the first embodiment is: in the present embodiment, the sub-gate is the sub-light transmissive section 122, that is, the sub-gate does not include the second gate section.

Figure 12:
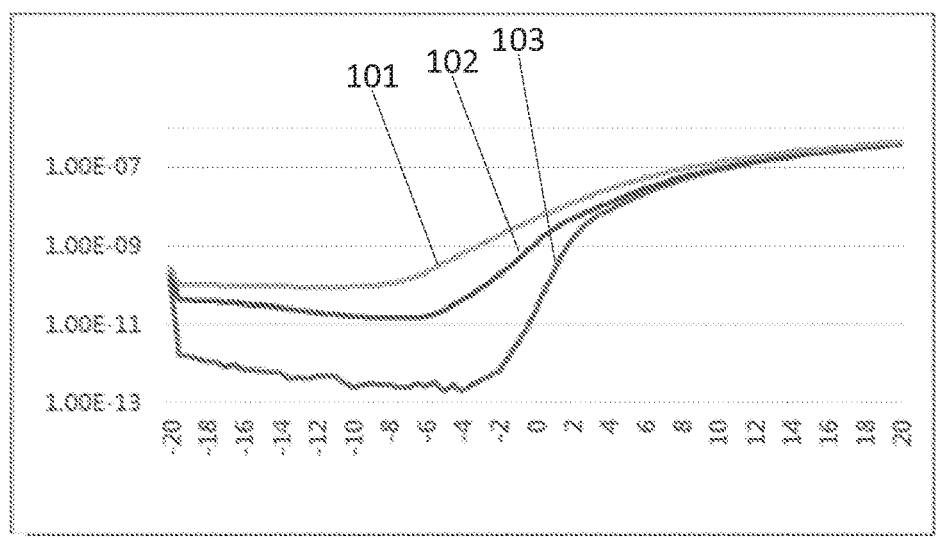
FIG. 12 is curve graphs showing current-voltage relationships when different positions of a sub-thin film transistor are irradiated with light.

As shown in FIG. 12, taking an active layer which is made of amorphous silicon as an example, a thickness of the active layer is 40 nm, the abscissa indicates the amount of voltage, the ordinate indicates the amount of current, and curved lines 102, 102, and 103 respectively indicate current-voltage relationships when the sub-TFT is irradiated with light from the bottom, is irradiated with light from the top, and is not irradiated with light. According to FIG. 12, a current generated when the sub-TFT is irradiated with light from the bottom is greater than a current generated when the sub-TFT is irradiated with light from the top.

In the display panel and the manufacturing method thereof provided by the present disclosure, a main gate and a sub-gate which are spaced from each other are formed on a glass substrate. At least a portion of the sub-gate includes a light transmissive area. A gate insulating layer is formed on the main gate, the sub-gate, and the glass substrate, a semiconductor layer is formed on the gate insulating layer, and a main active layer and a sub-active layer are formed by patterning the semiconductor layer. A position of the sub-active layer corresponds to a position of the light transmissive area. A second metal layer is formed on the main active layer, the sub-active layer, and the gate insulating layer. A main source/drain and a sub-source/drain are formed by patterning the second metal layer. Since a portion of the sub-gate which corresponds to the sub-active layer is the light transmissive area, a light irradiation area of a sub-thin film transistor (sub-TFT) is enlarged. As a result, a photocurrent is enhanced, thereby further improving sensitivity and accuracy of a touch control function.

The present disclosure has been described with preferred embodiments thereof. The preferred embodiments are not intended to limit the present disclosure, and it is understood that many changes and modifications to the described embodiment can be carried out without departing from the scope and the spirit of the disclosure that is intended to be limited only by the appended claims.

What is claimed is:

1. A method of manufacturing a display panel, comprising following steps:

forming a transparent electrode layer on a glass substrate, and patterning the transparent electrode layer to obtain a main light transmissive section and a sub-light transmissive section;

forming a first metal layer on the main light transmissive section, the sub-light transmissive section, and the glass substrate, and patterning the first metal layer to obtain a first gate section and a second gate section, wherein a main gate comprises the first gate section and the main light transmissive section, a sub-gate comprises the second gate section and the sub-light transmissive section, the main light transmissive section is covered by the first gate section, and a position corresponding to the sub-light transmissive section is a light transmissive area;

forming a gate insulating layer on the main gate, the sub-gate, and the glass substrate;

forming a semiconductor layer on the gate insulating layer, and patterning the semiconductor layer to obtain a main active layer and a sub-active layer, wherein a position of the sub-active layer corresponds to a position of the light transmissive area; and forming a second metal layer on the main active layer, the sub-active layer, and the gate insulating layer, and patterning the second metal layer to form a main source/drain and a sub-source/drain;

wherein a mask configured to pattern the transparent electrode layer and a mask configured to pattern the semiconductor layer are same.

2. The method of claim 1, wherein the sub-light transmissive section is not covered by the second gate section.

3. The method of claim 2, wherein the second gate section comprises a first part and a second part which are respectively disposed at two sides of the sub-light transmissive section.

4. The method of claim 3, wherein the main light transmissive section corresponds to a position of the main active layer.

5. The method of claim 1, further comprising following steps:
forming a passivation layer on the main source/drain and the sub-source/drain, wherein an opening is defined in the passivation layer; and
forming a pixel electrode on the passivation layer and in the opening, wherein the pixel electrode and the main drain are connected by the opening.

6. The method of claim 1, wherein a material of the transparent electrode layer comprises at least one of indium tin oxide (ITO), a nanosilver line, or aluminum-doped zinc oxide (AZO).

7. A method of manufacturing a display panel, comprising following steps:
forming a main gate and a sub-gate which are spaced from each other on a glass substrate, wherein at least a portion of the sub-gate comprises a light transmissive area;
forming a gate insulating layer on the main gate, the sub-gate, and the glass substrate;
forming a semiconductor layer on the gate insulating layer, and patterning the semiconductor layer to obtain a main active layer and a sub-active layer, wherein a position of the sub-active layer corresponds to a position of the light transmissive area; and
forming a second metal layer on the main active layer, the sub-active layer, and the gate insulating layer, and patterning the second metal layer to form a main source/drain and a sub-source/drain;
wherein the step of forming the main gate and the sub-gate comprises following steps:
forming a transparent electrode layer on the glass substrate, and patterning the transparent electrode layer to obtain a main light transmissive section and a sub-light transmissive section; and
forming a first metal layer on the main light transmissive section, the sub-light transmissive section, and the glass substrate, and patterning the first metal layer to obtain a first gate section and a second gate section, wherein the main gate comprises the first gate section and the main light transmissive section, the sub-gate comprises the second gate section and the sub-light transmissive section, the main light transmissive section is covered by the first gate section, and a position corresponding to the sub-light transmissive section is the light transmissive area; and
a mask configured to pattern the transparent electrode layer and a mask configured to pattern the semiconductor layer are same.

8. The method of claim 7, wherein the sub-light transmissive section is not covered by the second gate section.

9. The method of claim 8, wherein the second gate section comprises a first part and a second part which are respectively disposed at two sides of the sub-light transmissive section.

10. The method of claim 9, wherein the main light transmissive section corresponds to a position of the main active layer.

11. The method of claim 7, wherein the sub-gate, the sub-active layer, and the sub-source/drain form a sub-thin film transistor (sub-TFT); and
a first current is generated when a bottom of the sub-TFT is irradiated with light, a second current is generated when a top of the sub-TFT is irradiated with light, and the first current is greater than the second current.

12. The method of claim 7, further comprising following steps:
forming a passivation layer on the main source/drain and the sub-source/drain, wherein an opening is defined in the passivation layer; and
forming a pixel electrode on the passivation layer and in the opening, wherein the pixel electrode and the main drain are connected by the opening.

13. The method of claim 7, wherein a material of the transparent electrode layer comprises at least one of indium tin oxide (ITO), a nanosilver line, or aluminum-doped zinc oxide (AZO).

14. A display panel, comprising:
a glass substrate;
a main gate and a sub-gate disposed on the glass substrate and spaced from each other, wherein at least a portion of the sub-gate comprises a light transmissive area;
a gate insulating layer disposed on the main gate, the sub-gate, and the glass substrate;
a main active layer and a sub-active layer disposed on the gate insulating layer, wherein a position of the sub-active layer corresponds to a position of the light transmissive area;
a main source/drain disposed on the main active layer and the gate insulating layer; and
a sub-source/drain disposed on the sub-active layer and the gate insulating layer;
wherein the main gate comprises a first gate section and a main light transmissive section, the sub-gate comprises a sub-light transmissive section and a second gate section, the main light transmissive section is covered by the first gate section, and a position corresponding to the sub-light transmissive section is the light transmissive area, and the sub-light transmissive section and the sub-active layer are formed by a same mask.

15. The display panel of claim 14, wherein a position corresponding to the sub-light transmissive section is the light transmissive area.

16. The display panel of claim 15, wherein the second gate section comprises a first part and a second part respectively disposed at two sides of the sub-light transmissive section.

17. The display panel of claim 14, wherein a material of the sub-light transmissive section comprises at least one of indium tin oxide (ITO), a nanosilver line, or aluminum-doped zinc oxide (AZO).

* * * * *